(12) United States Patent
Anderson et al.

(10) Patent No.: US 8,880,855 B2
(45) Date of Patent: Nov. 4, 2014

(54) DUAL REGISTER DATA PATH ARCHITECTURE WITH REGISTERS IN A DATA FILE DIVIDED INTO GROUPS AND SUB-GROUPS

(75) Inventors: Timothy D Anderson, Dallas, TX (US); Duc Quang Bui, Grand Prairie, TX (US); Eric Biscondi, Opio (FR); Shriram D Moharil, Allen, TX (US); Mujibur Rahman, Plano, TX (US); Soujanya Narnur, Dallas, TX (US); Peter Richard Dent, Irthlingborough (GB); Ashish Rai Shrivastava, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 270 days.

(21) Appl. No.: 13/233,025

(22) Filed: Sep. 15, 2011

(65) Prior Publication Data

US 2012/0079247 A1    Mar. 29, 2012

Related U.S. Application Data (60) Provisional application No. 61/387,283, filed on Sep. 28, 2010.

(51) Int. Cl.
| | |
|---|---|
| *G06F 9/34* | (2006.01) |
| *H03K 21/00* | (2006.01) |
| *G06F 1/32* | (2006.01) |
| *H03K 19/00* | (2006.01) |
| *G06F 7/483* | (2006.01) |
| *G06F 12/02* | (2006.01) |
| *G06F 9/30* | (2006.01) |

(52) U.S. Cl.
CPC ............. *G06F 9/3012* (2013.01); *H03K 21/00* (2013.01); *G06F 1/3296* (2013.01); *H03K 19/0016* (2013.01); *G06F 7/483* (2013.01); *G06F 12/0246* (2013.01)
USPC ............................................ 712/220; 712/222

(58) Field of Classification Search
CPC ........................... G06F 9/30112; G06F 9/3012
USPC ................................................. 712/222, 220
See application file for complete search history.

(56) References Cited

U.S. PATENT DOCUMENTS

| | | | | |
|---|---|---|---|---|
| 6,260,137 | B1* | 7/2001 | Fleck et al. | 712/225 |
| 6,834,338 | B1* | 12/2004 | Hoyle et al. | 712/234 |
| 7,441,105 | B1* | 10/2008 | Metzgen | 712/220 |
| 2004/0034760 | A1* | 2/2004 | Paver et al. | 712/221 |
| 2005/0010743 | A1* | 1/2005 | Tremblay et al. | 712/10 |
| 2005/0125476 | A1* | 6/2005 | Symes et al. | 708/524 |
| 2008/0104375 | A1* | 5/2008 | Hansen et al. | 712/220 |

* cited by examiner

*Primary Examiner* — Andrew Caldwell
*Assistant Examiner* — Jyoti Mehta
(74) *Attorney, Agent, or Firm* — Robert D. Marshall, Jr.; Frederick J. Telecky, Jr.

(57) ABSTRACT

A processor includes a first and second execution unit each of which is arranged to execute multiply instructions of a first type upon fixed point operands and to execute multiply instructions of a second type upon floating point operands. A register file of the processor stores operands in registers that are each addressable by instructions for performing the first and second types of operations. An instruction decode unit is responsive to the at least one multiply instruction of the first type and the at least one multiply instruction of the second type to at the same time enable a first data path between the first set of registers and the first execution unit and to enable a second data path between a second set of registers and the second execution unit.

3 Claims, 7 Drawing Sheets

DUAL REGISTER DATA PATH ARCHITECTURE WITH REGISTERS IN A DATA FILE DIVIDED INTO GROUPS AND SUB-GROUPS

CLAIM OF PRIORITY

This application for Patent claims priority to U.S. Provisional Application No. 61/387,283 entitled "CACHE CONTROLLER ARCHITECTURE" filed Sep. 28, 2010, wherein the application listed above is incorporated by reference herein.

BACKGROUND

The demand for higher performance processing continues to require further increases of computational capacity in the latest DSP cores. Key areas in which more processing power is often needed include floating point and complex linear algebra. In addition, increases in general processing speeds are desired.

SUMMARY

The problems noted above are solved in large part by providing a processor that includes a first and second execution unit each of which is arranged to execute multiply instructions of a first type upon fixed point operands and to execute multiply instructions of a second type upon floating point operands. A register file of the processor stores operands in registers that are each addressable by instructions for performing the first and second types of operations. An instruction decode unit is responsive to the at least one multiply instruction of the first type and the at least one multiply instruction of the second type to at the same time enable a first data path between the first set of registers and the first execution unit and to enable a second data path between a second set of registers and the second execution unit.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and appended claims to refer to particular system components. As one skilled in the art will appreciate, various names can be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . " Further, the meaning of the term "or" (as an inclusive or an exclusive "or") is determined by the surrounding context in which the term is used. Also, the terms "coupled to" or "couples with" (and the like) are intended to describe either an indirect or direct electrical connection. Thus, if a first device couples to a second device, that connection can be through a direct electrical connection, or through an indirect electrical connection via other devices and connections. The term "multiply" is used herein for simplicity and is used to describe a multiplying of binary digits in fixed-point format and floating-point format.

Figure 1:
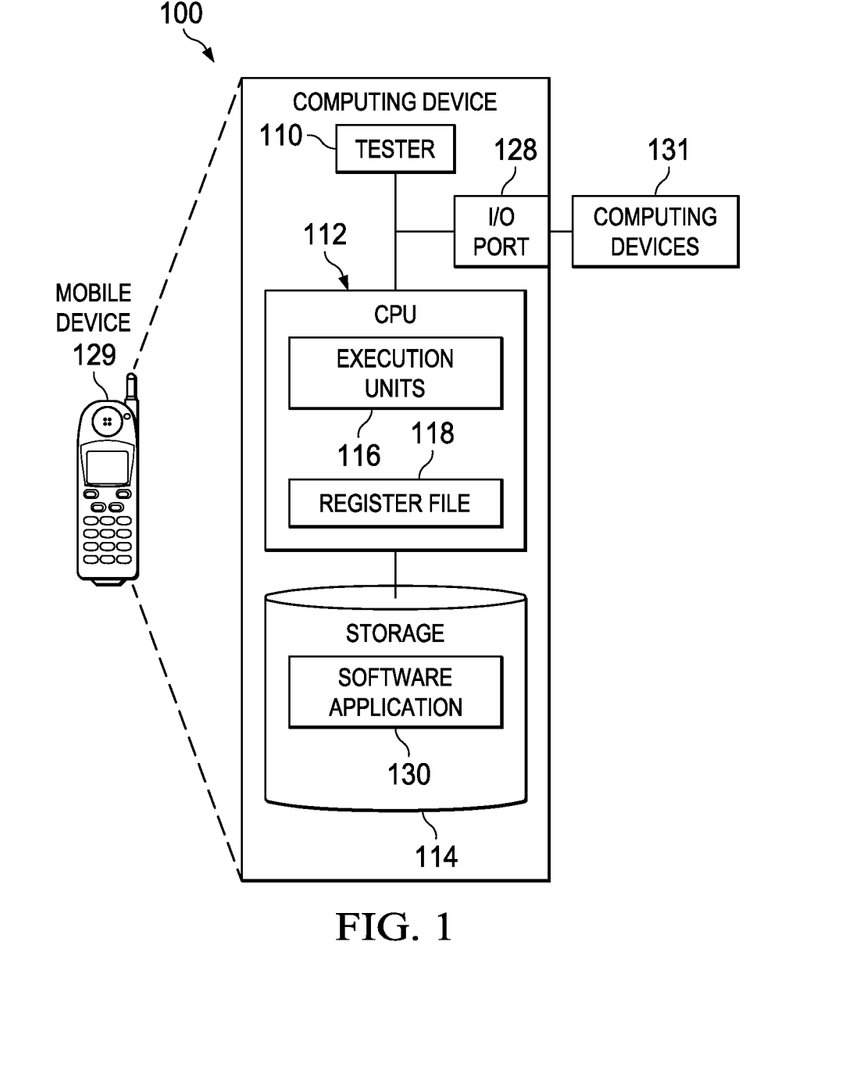
FIG. 1 shows an illustrative computing device in accordance with embodiments of the disclosure.

FIG. 1 shows an illustrative computing device 100 in accordance with embodiments of the disclosure. The computing device 100 is, or is incorporated into, a mobile communication device 129, such as a mobile phone, a personal digital assistant (e.g., a BLACKBERRY® device), a personal computer, a computer tablet, or any other type of electronic system.

In some embodiments, the computing device 100 comprises a megacell or a system-on-chip (SoC) which includes control logic such as a CPU 112 (Central Processing Unit), a storage 114 and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as random access memory (RAM), flash memory, or disk storage) stores one or more software applications 130 (e.g., embedded applications) that, when executed by the CPU 112, perform any suitable function associated with the computing device 100. The tester 110 comprises logic that supports testing and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 typically comprises memory and logic which store data and program information frequently accessed from the storage 114. Program instructions read by an instruction decoder control data transfer to/from the storage 114, the execution units 116, and the register file 118. Program instructions also control certain logic and/or arithmetic functions that use data in the register file 118 during the execution the software application 130. The CPU 112 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface).

Figure 2:
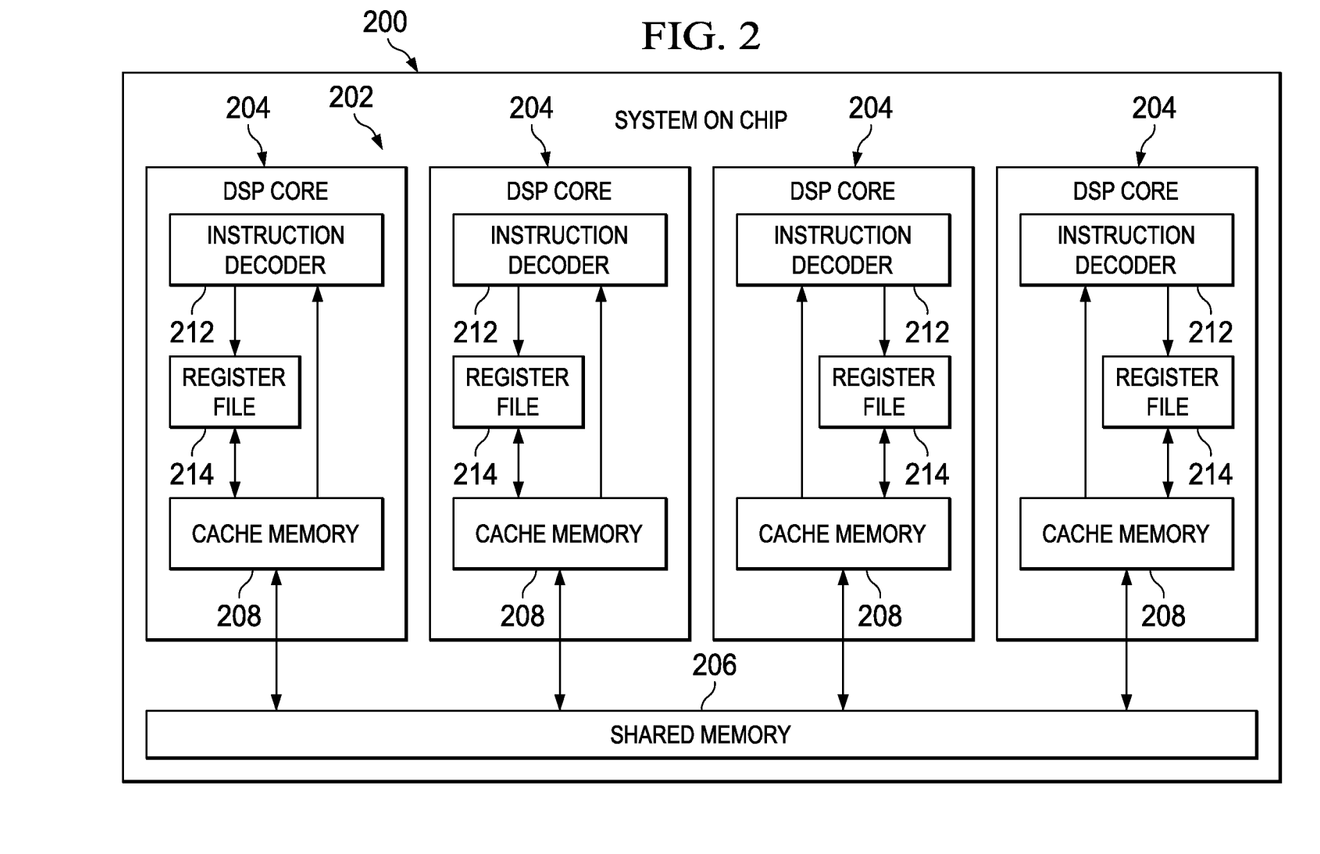
FIG. 2 is a block diagram illustrating a computing system on a chip in accordance with embodiments of the disclosure.

FIG. 2 is a block diagram illustrating a computing system 200 including multiple computing devices 202 (such as DSP cores 204), in accordance with embodiments of the disclosure. Computing system 200 is illustrated as a System on Chip (SoC) and includes one or more DSP cores 204. The DSP cores 204 send and receive instructions (e.g., program data) from a shared memory 206. The instructions and data are transferred between the shared memory 206 and a cache memory 208. Data transfer includes reading and writing data from/to each memory. Each DSP core 204 has a local memory such as cache memory 208. The cache memory 208 typically includes program memory and data memory, and is commonly synchronized random access memory (SRAM), for example. Although the illustrated elements of the computing system 200 are formed using a common substrate, the elements can also be implemented in separate circuit boards and packages (including the shared memory 206).

Each DSP core 204 additionally includes an instruction decoder 212 and a register file 216. The instruction decoder 212 reads instructions (ideally) from the cache 208. Decoded instructions from the instruction decoder 212 control the register file 214, including the reading and writing of data from/to the register file 214 and the cache 208. Each register in the register file 214 holds a word of data. In the description of an embodiment, one word is normally 32 bits of data, but a word can be any number of bits handled as a unit (such as 64 bits of data). (Context can be used to help determine the number of bits in a word.)

As disclosed herein, the instruction decoder 212 and the register file 214 reduce the number of logic levels used in physically implementing the instructions. The reduction of the number of logic levels contributes substantially to an improved overall DSP clock frequency because signal propagation paths are shortened by the reduction of the number of logic levels. Also, power and area requirements used while implementing these instructions are reduced, which improves system-level power and area budgets. Thus, adding an extra level of logic (as used in conventional designs) to expand conventional 32-bit designs to include 64-bit operands and 128-bit operands is avoided. Avoidance of adding extra logic levels additionally avoids lengthening signal propagation delays. A disclosed register file unit (such as register file unit 402 described below with reference to FIG. 4) is configured in a manner that enables access to either half of the register file unit without increasing delays within the overall critical path in the logic, and also typically provides area and power savings.

Figure 3:
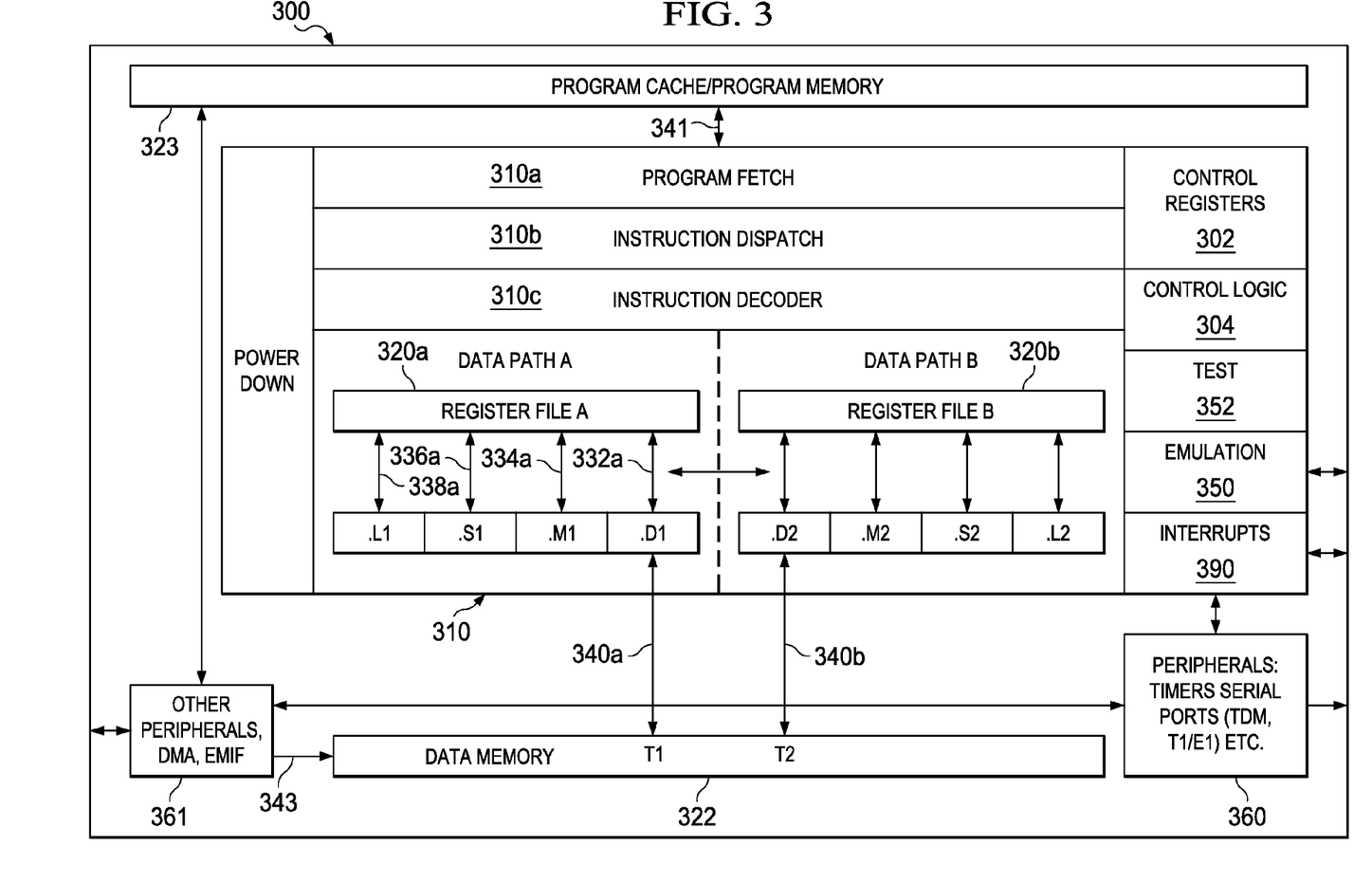
FIG. 3 is a logic diagram illustrating an architecture of a processor in accordance with embodiments of the disclosure.

FIG. 3 is a block diagram of a microprocessor 300 (such as DSP core 204), which is an embodiment of the present disclosure. Microprocessor 300 is a VLIW (very long instruction word) digital signal processor (DSP) in an integrated circuit, for example. For simplicity, FIG. 3 shows only certain portions of microprocessor 300. Details of general construction for DSPs are well known, and may be found readily elsewhere. For example, U.S. Pat. No. 5,072,418 issued to Frederick Boutaud, et al, describes principles of DSPs and is incorporated herein by reference. U.S. Pat. No. 5,329,471 issued to Gary Swoboda, et al, describes test and emulation of DSPs and is incorporated herein by reference.

In FIG. 3, microprocessor 300 includes a central processing unit (CPU) 310. The CPU 310 includes an instruction unit 310a-c. The instruction unit 310a-c includes a program fetch unit 310a, an instruction dispatch unit 310b with instruction packing, and an instruction decoder unit 310c. The processing of instructions occurs in each of the two data paths (data path A and data path B), each of which is coupled to four functional units (.L, .S, .M, and .D), and a register file unit. Register file A (320a) and B (320b) each include 32 registers. Each register of register file A (320a) and register file B (320b) is a 32-bit general-purpose register. Emulation circuitry 350 provides access to the internal operation of the microprocessor integrated circuit 300 that is controlled by an external test/development system for debugging. Test circuitry 352 includes control registers and parallel signature analysis circuitry for testing the integrated circuit 300. Control registers 302 and control logic 304 are used to configure and control various CPU 310 operations. Interrupts circuitry is used to handle requests from external peripherals 360.

CPU 310 is arranged in accordance with a pipelined architecture. A pipeline in CPU 310 typically includes three phases: fetch, decode, and execute. As instructions flow through the pipeline phases, different portions of the instructions are processed by different parts of the CPU. In the illustrated embodiment, the instruction unit 310a-c implements the fetch and decode stages, and the functional units implement the execution stage under control of the instruction unit 310a-c.

The program fetch unit 310a fetches instructions from program memory 323 using bus 341. Instructions are received by the instruction fetch unit 310a in fetch packets. Fetch packets are split into execute packets by the instruction dispatch unit 310b. Execute packets typically include a single instruction, or, from two to eight parallel instructions, for example. The instruction dispatch unit 310b assigns the instructions in the execute packet to the appropriate functional unit (e.g., .L, .S, .M, or .D functional units). Finally, the instruction decoder 310c determines the source registers, destination registers, and associated paths used for the execution of the instructions in the functional units. Decoded instructions are provided from the instruction decoder 310c to the functional units over various sets of control lines, which are not shown (for clarity). The instruction decoder unit 310c can dispatch eight parallel instructions every cycle to the execution units.

The instruction decoder unit 310c controls the functional units to execute fixed-point and floating-point operations on data. Data is provided to/from the register files via the load/store units, and read/written by functional units from the register files. For example in data path A, data in data memory 322 is read/written from/to registers in the register file A (320a) via load/store unit .D1 and over a set of busses 332a and 340a. Data in register file A is read/written to multiplier .M1 over bus 334a, to ALU/shifter unit .S1 over a set of busses 336a, and to ALU .L1 over a set of busses 338a. Likewise in data path B, data in data memory 322 is read/written from/to registers in the register file b (320b) via load/store unit .D2 and over a bus 340b. Data in register file B is read/written to multiplier .M2, to ALU/shifter unit .S2, and to ALU .L2 in a similar manner.

Each of the 32 registers in register file A (320a) is a 32-bit register. Registers in register file A (320a) are referenced as A0-A31. Registers in register file A (320a) are general purpose registers. General-purpose registers can be used for data, data address pointers, or condition registers. Any number of reads of a given register can be performed in a master clock cycle. The data path B is similar to data path A and extends between register file B (320b), functional units .D2, .M2, .S2, and .L2, and data memory bus 340b.

The data memory 322 and program memory 323 are shown in FIG. 3 to be a part of a microprocessor 300 integrated circuit. The memories 322-323 could instead be external to the microprocessor 300 as a matter of design choice. Also, the particular selection and number of execution units are a matter of design choice. When microprocessor 300 is incorporated in a data processing system, additional memory or peripherals 360 may be coupled to microprocessor 300, as illustrated in FIG. 3. Microprocessor 300 can further include memory controllers to move data between microprocessor 300 and external memory and peripherals 361 such as external memory controllers, extended memory controllers, and unified memory controller. Peripherals 361 communicate with external data memory 322 using bus 343. In the present embodiment, CPU 310 is encapsulated as a megamodule, however, other embodiments of the present invention may be in custom designed CPUs or mass market microprocessors, for example.

In FIG. 3, multiplier unit .M1 executes fixed-point and floating-point multiplication and other arithmetic operations. The fixed-point or floating-point instructions are executed on an instruction by instruction basis as the fixed-point and floating-point capability is fully integrated. The floating-point operations in the .M1 unit include: a single precision complex multiplication, vector multiplication, single precision vector addition and subtraction, vector conversion of single-precision floating-point to/from integer, double-precision floating-point arithmetic (addition, subtraction, multiplication, division, and conversion to/from integer) supported and fully pipelinable. The fixed-point operations in the .M1 unit include: complex vector and matrix multiplications, real vector multiplications, dot product calculation, vector addition and subtraction, vector shift, vector comparison, and vector packing and unpacking The arithmetic logic unit (ALU).L1, and ALU/shifter unit .S1 perform a general set of arithmetic, logical, shifting, and branch functions on fixed-point and floating-point operands in register file A (320a). Arithmetic operations such as addition and subtraction can be constructed from logical operations such as AND, OR, NOT, XOR, and the like. The .D1 unit performs load/store operations and arithmetic operations on data transferred from/to register file A (320a).

In an embodiment illustrated using FIG. 3, a fixed-point and a floating-point instruction are fetched from program memory 323. The fixed-point instruction is assigned to the ALU unit .L1, and the floating-point instruction is assigned to the multiplier unit .M1. The instruction decoder 310c decodes associated paths in data path A to arrange the register A0 in register file A (320a) to be the source register for the fixed-point instruction and the floating-point instruction. That is, the instruction decoder 310c arranges data path A to be coupled to register A0 to the ALU unit .L1 and to couple the same register A0 to the multiplier unit .M1. In the execution phase of the pipeline and in response to the instruction decoder 310c, the ALU unit .L1 reads the value of the operand stored in the register A0 and performs a fixed-point operation using that value. In the next clock cycle of the execution stage, a floating-point value is stored in the register A0. In the subsequent clock cycle of the execution stage, the multiplier unit .M1 reads the value of the operand stored in the register A0 and performs a floating-point operation using that value.

In another embodiment illustrated with FIG. 3, the instruction decoder 310c decodes a floating-point multiply instruction and a floating-point addition instruction to be executed in the same pipeline. The instruction decoder 310c arranges data path A so that the register pair A15:A14 in register file A (320a) is coupled to the ALU unit .L1 and to the multiplier unit .M1. The register pair A15:A14 thus stores a 64-bit double-word operand. The multiplier unit .M1 reads the value of the operand stored in A15:A14, executes a floating-point multiply using the value, and stores the floating-point result as a double-word operand in A15:A14. In the next clock cycle, the ALU unit .L1 reads the floating-point result from A15:A14 and performs a double-word floating-point addition operation.

In yet another embodiment illustrated with FIG. 3, the instruction decoder 310c decodes a floating-point multiply instruction and a floating-point to fixed-point conversion instruction to be executed in the same pipeline. The instruction decoder 310c enables a data path from the register quadruplet (quad) A31:A30:A29:A28 in register file A (320a) to the ALU unit .L1 and from the register quad A31:A30:A29:A28 in register file A (320a) to the multiplier unit .M1. A 128-bit four-word operand is stored in the register quad A31:A30:A29:A28. The multiplier unit .M1 reads the value of the operand stored in register quad A31:A30:A29:A28, and executes a floating-point multiply using the value. In the same clock cycle (e.g., nearly simultaneously), the ALU unit .L1 reads the 128-bit floating-point operand from the register quad A31:A30:A29:A28 and performs a floating-point to fixed-point conversion.

Figure 4:
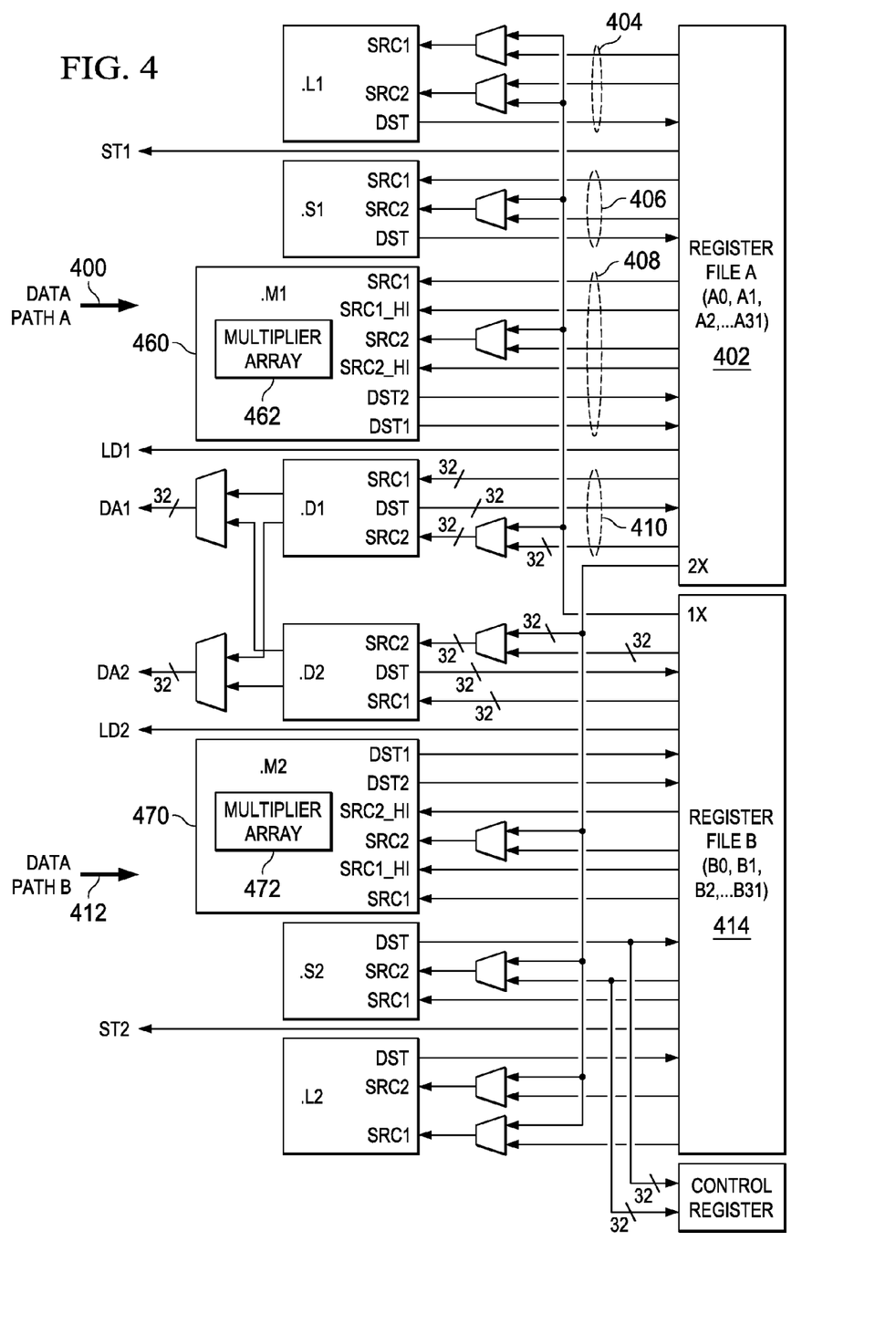
FIG. 4 is logic diagram illustrating execution units and a register file unit in accordance with embodiments of the disclosure.

FIG. 4 is a functional diagram of data path A and data path B in an embodiment of the disclosure. FIG. 4 shows a more detailed view of the busses described in FIG. that are used to establish data paths between and amongst the various functional blocks.

In FIG. 4, data path A (400) includes register file A (402) and execution units .L1, .S1, .M1, and .D1. Register file A (402) in data path A (400) is coupled to execution units .L1, .S1, .M1 via 64-bit data buses 404, 406, 408, and to .D1 via 32 bit data buses 410. Each of execution units .L1, .S1, .M1, and .D1 execute fixed and floating-point operations on the operands stored in register file A (402). Data path B (412) is similarly arranged as data path A (400). Data path B (412) cross-couples with data path A (400) as illustrated and communicates with register file B (414) and execution units .L2, .S2, .M2, and .D2.

Although the width of each register in each register file 402, 414 is 32 bits, the register file supports data formats ranging in bit width from packed 8-bit data through 128-bit data. The data can be either fixed-point or floating-point data. In register file A (402), long word operands (e.g., 40 bits wide sign-extended to 64 bits) and double word operands (e.g., 64 bits wide) are stored in register pairs. Quadruple (quad) word operands (e.g., 128 bits wide) are stored in four consecutive registers.

An embodiment of operand storage in a register file with 32 registers of 32-bits each is illustrated in Table 1. The Table provides one example of how data can be allocated to registers within Register File A in accordance with register address boundaries (for example, registers A0, A1, A2, and A3 define a register "quad" can be used to store a quad-sized word, two double sized words, or four regular sized words of 32-bits each. Table 1 uses assembly language syntax, in which a colon between the register names denotes consecutive register concatenation to store operands larger than one word. For example, a 64-bit operand is stored in the register pair A3:A2. The first word A2 is the LSW, and the second word A3 is the MSW. The 128-bit operand is stored in the four consecutive registers A7:A6:A5:A4 (e.g., a register quad), such that A7 holds the MSB of the 128-bit operand and A4 holds the LSB of the 128-bit operand.

TABLE 1

Operand Storage in Register File A

| Register Sets | Operand Size Stored |
|---|---|
| A0 | Word |
| A1 | Word |
| A3:A2 | Double |

TABLE 1-continued

Operand Storage in Register File A

| Register Sets | Operand Size Stored |
|---|---|
| A7:A6:A5:A4 | Quad |
| A8 | Word |
| A9 | Word |
| A10 | Word |
| A11 | Word |
| A15:A14:A13:A12 | Quad |
| A17:A16 | Double |
| A19:A18 | Double |
| A21:A20 | Double |
| A23:A22 | Double |
| A25:A24 | Double |
| A27:A26 | Double |
| A28 | Word |
| A29 | Word |
| A30 | Word |
| A31 | Word |

The word order (e.g., word significance) in Table 1 is descending left to right. The MSW of the operand is stored in the left-most register and the LSW is stored in the right-most register. For example, in Table 1 the MSW of the quad word stored in the consecutive registers A15:A14:A13:Al2 is stored in register A15, and the LSW of the same quad operand is stored in A12. Word order is not necessarily limiting and other embodiments include a reverse word ordering, for example.

In FIG. 4, the fixed and floating-point units .L1, .S1, and .M1, are coupled to the register file A (402) by 64-bit signals. Execution unit .L1 has two 64-bit input ports src1 and src2 to support two 64-bit operands. The 64-bit output port dst writes a 64-bit result to a register pair in register file A. Similarly, execution unit .S1 has two 64-bit input ports src1 and src2 to support two 64-bit operands, and 64-bit output port dst writes a 64-bit result to register file A. The .M unit includes four 64-bit read ports that support up to two quad (e.g., 128 bit) operands. The two 64-bit read ports src_1 and src1_hi can be concatenated to receive a first quad word operand from register file A. The two 64-bit read ports src_2 and src2_hi can also be concatenated to receive a second quad word operand from register file A. The two 64-bit write ports dst1 and dst2 can be concatenated to write a quad word result to consecutive registers in register file A. The bus signals coupled to register file A and the .D1 unit are 32 bits wide.

Cross paths illustrated in FIG. 4 allow each of the four functional units from one data path to read a 32-bit or a 64-bit operand from the register file of the opposite data path. The functional units .M1, .L1, .S1, .D1 in data path A (400) are connected to the register file B (414) in data path B (412) by cross path 1X. Functional units .M2, .L2, .S2, .D2 in data path B (412) are connected to register file A (402) in data path A (400) by cross path 2X. The src2 inputs of the .M, .S, and .D units in both data paths are selectable between the cross path and the same side register file. In the case of the .L units, both src1 and src2 inputs are selectable between the cross path and the same-side register file. Thus, multiple units on a side may read the same cross-path source simultaneously. Also, the cross path operand for one side may be used by any one, multiple, or all the functional units on that side in an execute packet.

The .M1 functional unit 460 and the .M2 functional unit 470 are execution units that are arranged to execute multiply instructions of a first type upon fixed point operands and to execute multiply instructions of a second type upon floating point operands. The instruction decoder unit 310c is responsive to the at least one multiply instruction of the first type and the at least one multiply instruction of the second type to at the same time enable a first data path between the first set of registers and the first execution unit and to enable a second data path between a second set of registers and the second execution unit. The first data path is coupled to a multiplier array (such as multiplier array 462) of the first execution unit and the second data path is coupled to a multiplier array (such as multiplier array 472) of the second execution unit. Each multiplier array is arranged to execute multiply operations upon fixed point operands and upon floating point operands.

This solution optimizes area between floating point and integer multiplication operations (in contrast to convention solutions from having separate fixed and floating point multipliers). Additionally separate data paths to the separate fixed and floating point multipliers are eliminated. Further, the .M1 functional unit 460 and the .M2 functional unit 470 can independently (of each other) perform multiply operations on operands of either a fixed or floating point without a data conversion operation being necessary to use the specified .M unit. Thus, execution times of various algorithms that use both fixed and floating point operands are improved using the techniques disclosed herein.

Figure 5:
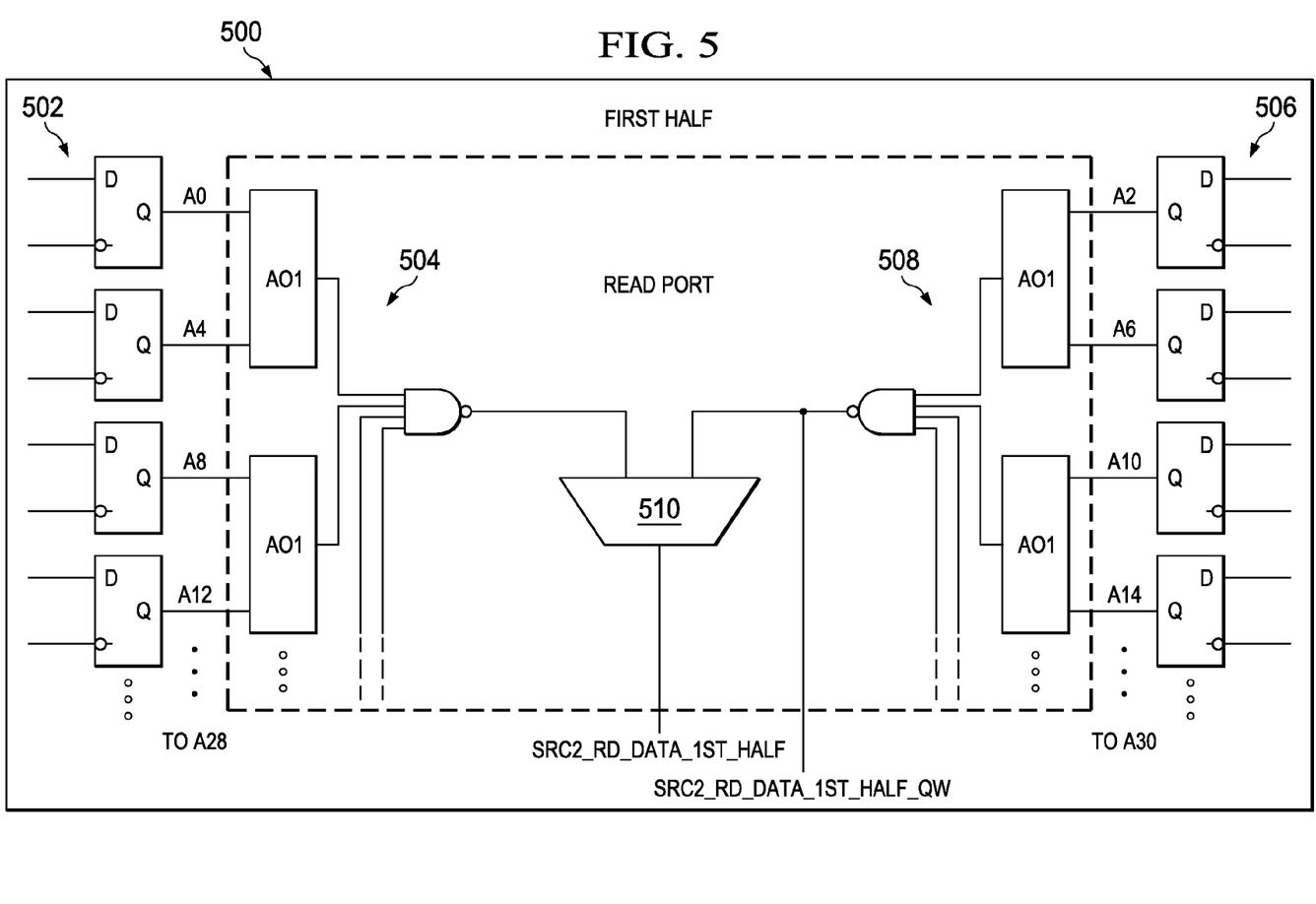
FIG. 5 is logic diagram illustrating a first half of the register file unit in accordance with embodiments of the disclosure.
Figure 6:
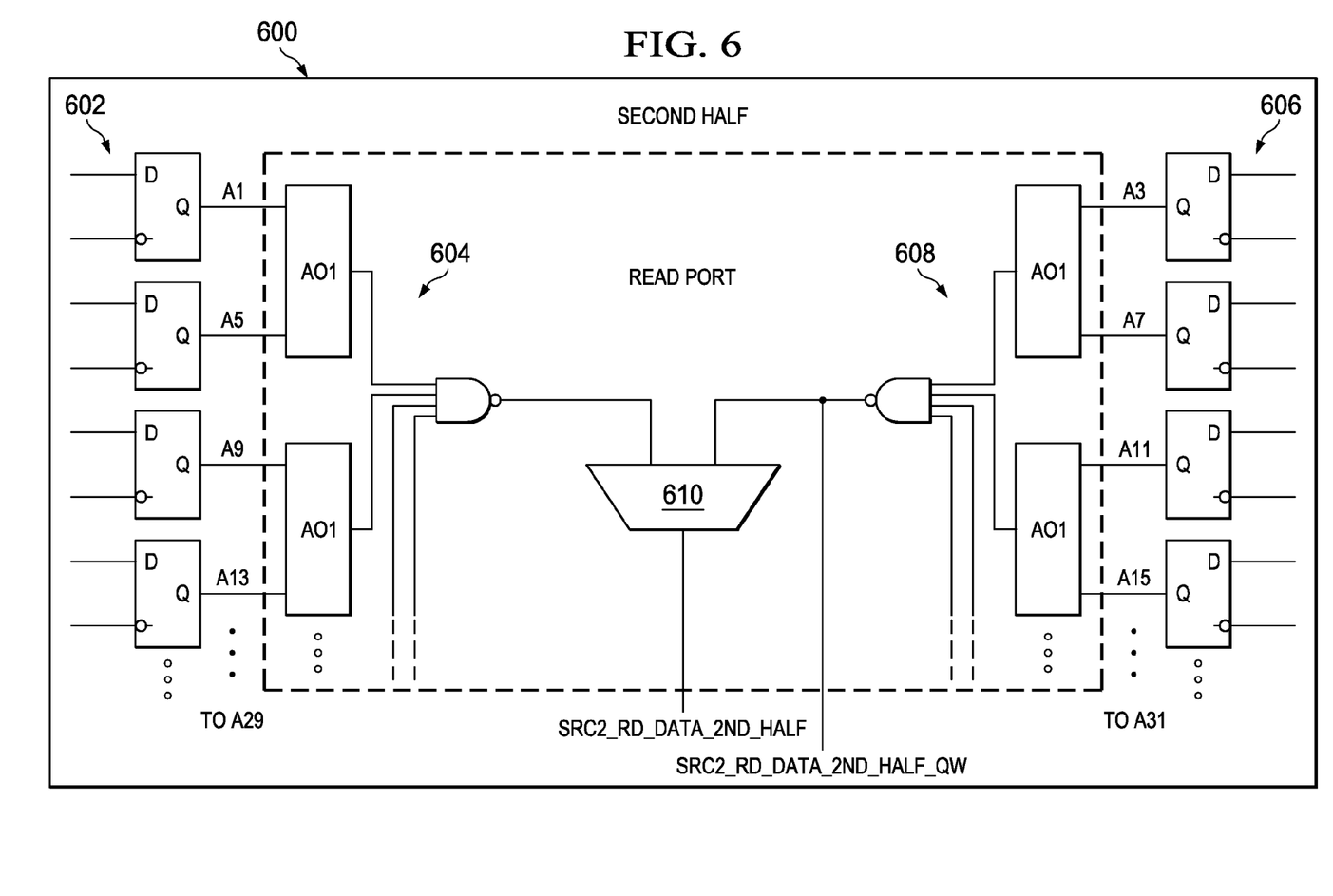
FIG. 6 is logic diagram illustrating a second half of the register file unit in accordance with embodiments of the disclosure.
Figure 7:
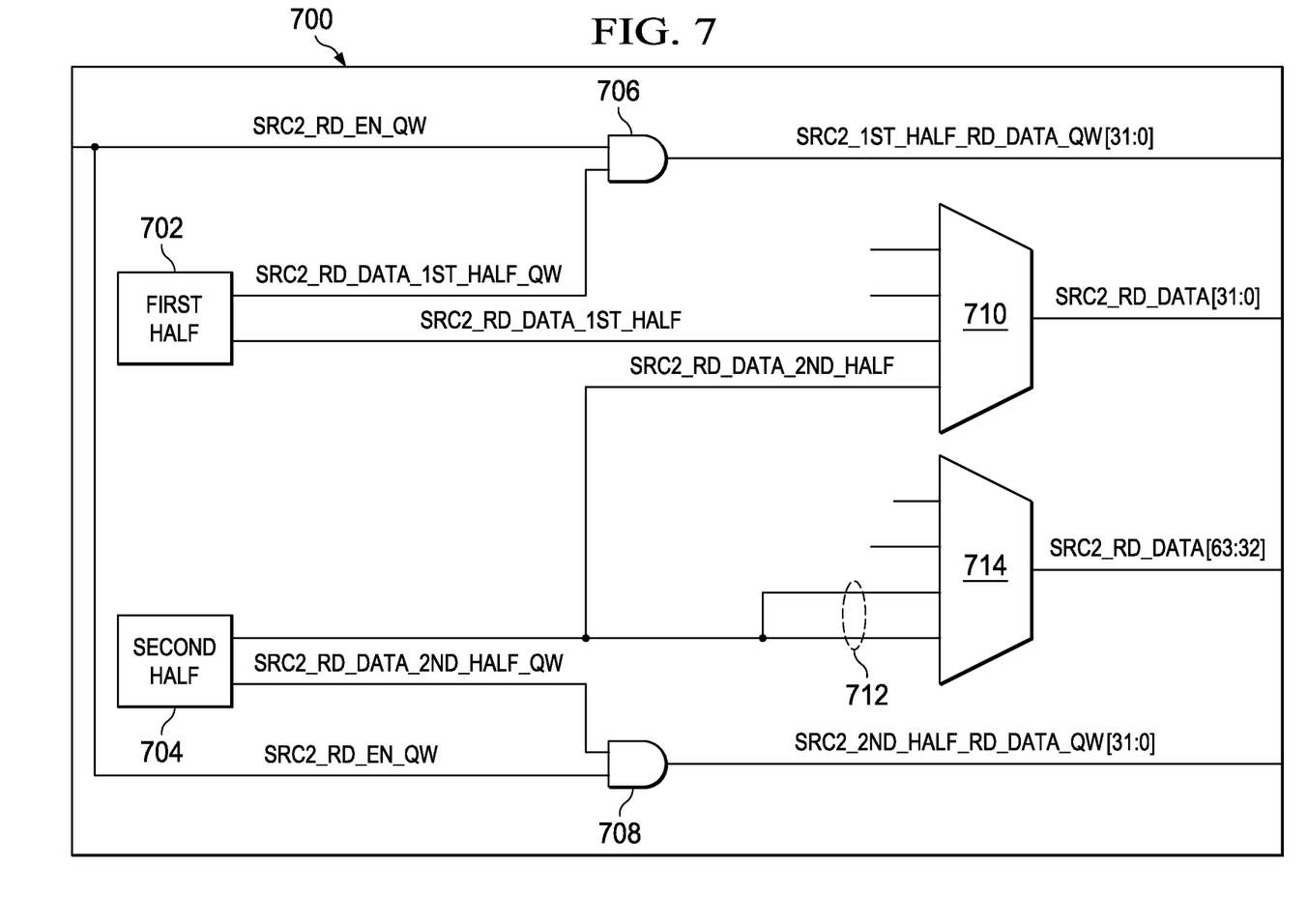
FIG. 7 is a logic diagram illustrating a register file unit in accordance with embodiments of the disclosure.

In an embodiment of the present disclosure, a register file is arranged to read or write all bits of any operand stored in one or more of the registers in the register file. The registers in the register file are arranged into a first half and a second half. The first half of the registers in the register file is illustrated in FIG. 5. The second half of the registers in the register file is illustrated in FIG. 6. FIG. 7 illustrates the register file, in which the first half and the second half are arranged to enable the reading of any operand. Operands can be any size, including one, two, and four words long, for example.

FIG. 5 shows the first half 500 of the register file. The first half 500 includes two groups of registers. The first group 502 includes registers A0, A4, A8, Al2, . . . , A28. An instruction decoder (such as instruction decoder 310c) controls the outputs of each of the registers and/or a first combinational logic 504 (including plural units A01, each connected to a pair of registers of the first group 502, and a NAND gate) to select the output of an individual register (e.g., register A4) to produce a 32-bit output for the first group. The second group 506 includes registers A2, A6, A10, A14, . . . , A30. The instruction decoder controls the outputs of each of the registers and/or a second combinational logic 508 (including plural units A01, each connected to a pair of registers of the second group 506, and a NAND gate) to select the output of an individual register (e.g., register A10) from among the registers in the second group 506 to be the 32-bit output of the second group 506. The instruction decoder controls the first-half multiplexer 510 to select between the output of the first group 502 and the output of the second group 506. The first output (src2_rd_data__1st_half) of the first half 500 is either the output of an individual register from the first group 502 or the output of an individual register from the second group 506. The output src2_rd_data__1st_half of the multiplexor 510 is the first output signal of the first half 500. The second output signal (src2_rd_data__1st_half_qw) of the first half 500 is the selected output of the second group 506.

FIG. 6 shows the second half 600 of the registers in the register file. The second half of the register file includes two groups. The third group includes registers Al, A5, A9, A13, . . . , A29. The instruction decoder controls the outputs of each of the registers and/or a third combinational logic 604 (including plural units A01, each connected to a pair of registers of the third group 602, and a NAND gate) to select the output of an individual register (e.g., A13) from among the registers in the third group 602 to produce a 32 bit output for the third group 602. The fourth group 606 in the second half 600 includes registers A3, A7, A11, A15, . . . , A31. The instruction decoder controls the outputs of each of the registers and/or a fourth combinational logic 608 (including plural units A01, each connected to a pair of registers of the fourth group 606, and a NAND gate) to select the output of an individual register (e.g., A15) from among the registers in the fourth group to be the 32-bit output of the fourth group 606. The instruction decoder controls the first-half multiplexer 610 to select between the output of the third group 602 and the output of the fourth group 606. The output of the second-half multiplexor 610 is either the output of an individual register from the third group 602 or the output of an individual register from the fourth group 606. The output (src2_rd_data__2nd_half) of the multiplexer 610 is the first output of the second half 600. The second output signal (src2_rd_data__2nd_half_qw) of the second half 600 is the selected output of the fourth group 606.

FIG. 7 illustrates a register file 700 arranged to expose all bits of a one-, two-, or four-word operand stored in one or more registers in the register file 700. The register file 700 includes a first half 702 (such as first half 500) and a second half 704 (such as second half 600). In FIG. 7 the first output of the first half is src2_rd_data__1st_half and the second output of the first half is src2_rd_data__1st_half_qw. The first output of the second half is src2_rd_data__2nd_half and the second output of the second half is src2_rd_data__2nd_half_qw.

The register file 700 in FIG. 7 has four 32-bit output signals that can be concatenated to form a 128-bit wide output that supports an operand of four words. Using assembly language notation, the four-word 128-bit concatenated output is src2__2nd_half_rd_data_qw[31:0]: src2__1st_half_rd_data_qw[31:0]:src2_rd_data[63:32]:src2_rd_data[31:0]. Thus, the output signal src2__2nd_half_rd_data[31:0] is the MSW and src2_rd_data[31:0] is the LSW of the 128-bit four-word operand. The first word of the four-word operand is represented by the signal src2_rd_data[31:0]. The second word of the four-word operand is represented by the signal src2_rd_data[63:32]. The third word of the four-word operand is represented by the signal src2__1st_half_rd_data_qw[31:0]. The fourth word of the four-word operand is represented by src2__2nd_half_rd_data_qw[31:0].

The third and fourth words of the operand, src2__1st_half_rd_data_qw[31:0] and src2__2nd_half_rd_data_qw[31:0] respectively, are controlled by and instruction decoder (such as instruction decoder 310c) via the enable signal src2_rd_en_qw. The register file output signals src2__1st_half_rd_data_qw[31:0] and src2__2nd_half_rd_data_qw[31:0] are the outputs of the enable gates 706, 708 respectively. When src2_rd_en_qw is logic 1 or high, the output of the enable gate 706 is src2__1st_half_rd_data_qw[31:0] and the output of the enable gate 708 is src2__2nd_half_rd_data_qw[31:0]. When enable is logic 0 or low, the register file output signals src2__1st_half_rd_data_qw[31:0] and src2__2nd_half_ rd_data_qw[31:0] are both logic 0 or low.

The output signal src2_rd_data[31:0] in FIG. 7 is the output of the multiplexer 710. The inputs to the multiplexor 710 are src2_rd_data__1st_half and src2_rd_data__2nd_half. The signal src2_rd_data__1st_half is the output of any individual register in the first half 702 of the register file 700. The signal src2_rd_data__2nd_half is the output of any individual register in the second half 704 of the register file 700. The instruction decoder controls the multiplexer 710 to output any individual register from the first half 702 or from the second half 704 of the register file 700. Thus, the output of the multiplexer 710 is any particular individual register among the registers A0-A31 in the register file 700. The multiplexor 714 has two inputs 712 that are the same signal, thus making the multiplexor functionally equivalent to a buffer (for timing purposes, for example). The multiplexer 714 serves as a buffer with sufficient delay to balance signal propagation. Without multiplexor 714 the signal src2_rd_data[63:32] is susceptible to clock timing issues such as racing, for example.

In an embodiment the disclosure, a VLIW fixed-point multiply instruction requires a 32-bit one-word operand in register A9 of a register file (such as the register file 700 in FIG. 7 with operand storage as illustrated in Table 1) to be read by a multiplier unit (such as multiplier unit .M1 in FIG. 4). An instruction decoder (such as instruction decoder 310c in FIG. 3) controls the combinational logic and the second-half mux in the second half of the register file (such as third combinational logic 604, mux 610, and second half 600 respectively) to output the value of the operand in register A9 to the second-half output src2_rd_data__2nd_half. In the register file the instruction decoder controls a multiplexor (such as the multiplexor 710) to select the input src2_rd_data__2nd_half as the register file output signal src2_rd_data[31:0]. The value of the operand in register A9 is held on the src2_rd_data[31:0] until the multiplier reads the value.

In another embodiment of the disclosure, a VLIW floating-point multiply instruction requires a 64-bit two-word operand in consecutive registers A3:A2 of a register file (such as the register file 700 in FIG. 7 with operand storage as in Table 1) to be read by a multiplier unit (such as multiplier unit .M1 in FIG. 4). An instruction decoder (such as instruction decoder 310c) controls combinational logic and a first-half mux in a first half of the register file (such as first combinational logic 504, mux 510, and first half 500 respectively) to output the value of the operand in register A2 to the first-half output src2_rd_data__1st_half. The instruction decoder controls the combinational logic and the second-half mux in the second half of the register file (such as fourth combinational logic 608, mux 610, and second half 600 respectively) to output the value of the operand in register A3 to the second-half output src2_rd_data__2nd_half. In the register file the instruction decoder controls a first multiplexor (such as the multiplexor 710) to select the input src2_rd_data__1st_half as the register file output signal src2_rd_data[31:0]. The signal src2_rd_data__2nd_half propagates through a multiplexor (such as multiplexor 714) to the register file output signal src2_rd_data[63:32]. The value of the operand stored in consecutive registers A3:A2 is held on the src2_rd_data[63:0] until the multiplier reads the value.

In yet another embodiment of the disclosure, a VLIW floating-point multiply instruction requires a 128-bit four-word operand in consecutive registers A7:A6:A5:A4 of a register file (such as the register file 700 with operand storage such as in Table 1) to be read by a multiplier unit (such as multiplier unit .M1 in FIG. 4). An instruction decoder (such as instruction decoder 310c) controls combinational logic and a first-half mux in a first half of the register file (such as first combinational logic 504, mux 510, and first half 500 respectively) to output the value of the operand in register A4 to the first-half output signal src2_rd_data__1st_half. The instruction decoder also controls the combinational logic in the first half (such as second combinational logic 508 in first half 500 respectively) to select the output of register A6 as the second output of the first half (src2_rd_data__1st_half_qw). The instruction decoder controls the combinational logic and the second-half mux in the second half of the register file (such as third combinational logic 604, mux 610, and second half 600 respectively) to output the value of the operand in register A5 to the second-half output (src2_rd_data__2nd_half). The instruction decoder also controls the combinational logic in the second half (such as fourth combinational logic 608 in second half 600 respectively) to select the output of register A7 as the second output of the second half, src2_rd_data_2nd_half_qw. The instruction decoder controls a first multiplexor (such as the multiplexor 710 in FIG. 7) in the register file to select the signal src2_rd_data_1st_half as the register file output signal src2_rd_data[31:0]. Thus the value of the output signal src2_rd_data[31:0] is the value of the register A4, and is the LSW of the 128-bit operand. A second multiplexor (such as the multiplexor 714) propagates the signal src2_rd_data_2nd_half to the register file output signal src2_rd_data [63:32]. Therefore the value of the output signal src2_rd_data [63:32] is the value of the register A5 from the first group of the second half of the register file.

The VLIW floating-point multiply instruction decoder turns on the enable signal src2_rd_en_qw by setting the signal high (e.g., to a logic 1). Enable logic (such as enable logic 706) selects src2_rd_data_1st_half_qw as the output signal src2_1st_half_rd_data_qw[31:0]. The value of the output signal src2_1st_half_rd_data_qw[31:0] is therefore the value of the register A6 from the second group of the first half of the register file. Enable logic (such as enable logic 708) selects src2_rd_data_2nd_half_qw as the output signal src2_2nd_half_rd_data_qw[31:0]. The value of the output signal src2_2nd_half_rd_data_qw[31:0] is therefore the value of the register A7 from the second group of the second half of the register file. The value of the operand stored in consecutive registers A7:A6:A5:A4 is held at the output of the register file until the multiplier reads the 128-bit four word value.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A data processor comprising:
   a program fetch unit to fetch instructions from memory, each instruction specifying a corresponding data processing operation and a corresponding data processing operand specified by register number, said operand having a data size, specified by said fetched instruction, selected from a set including N bits and 2N bits;
   a decode unit, connected to said program fetch unit, to receive fetched instructions and to decode said fetched instructions;
   a data register file including a plurality of data registers designated by register number, each data register storing data having a length of N bits;
   at least one functional unit connected to said decode unit and said data register file, said functional unit to perform a data processing operation specified by a corresponding instruction upon said operand specified by said corresponding instruction; and
   wherein said data register file further includes an operand selection unit comprising
      a first half of said data register file including
         a first group of registers including a data register having a least register number and data registers having every fourth sequential register number in the said data register file following said least register number,
         a first combinational logic selecting N bits from one of said first group of registers corresponding to said operand specified by said corresponding instruction,
         a second group of registers including a data register having a third least register number and data registers having every fourth sequential register number in the said data register file following said third least register number,
         a second combinational logic selecting N bits from one of said second group of registers corresponding to said operand specified by said corresponding instruction,
         a first half register multiplexer connected to said first combinational logic and said second combinational logic selecting said N bits selected by said first combinational logic or said N bits selected by said second combinational logic corresponding to said operand specified by said corresponding instruction,
      a second half of said data register file including
         a third group of registers including a data register having a second least register number and data registers having every fourth sequential register number in the said data register file following said second least register number,
         a third combinational logic selecting N bits from one of said third group of registers corresponding to said operand specified by said corresponding instruction,
         a fourth group of registers including a data register having a fourth least register number and data registers having every fourth sequential register number in the said data register file following said fourth least register number,
         a fourth combinational logic selecting N bits from one of said fourth group of registers corresponding to said operand specified by said corresponding instruction,
         a second half register multiplexer connected to said third combinational logic and said fourth combinational logic selecting said N bits selected by said third combinational logic or said N bits selected by said fourth combinational logic corresponding to said operand specified by said corresponding instruction,
      a multiplexer connected to said first half register multiplexer and said second half register multiplexer selecting said N bits selected by said first half register multiplexer or said N bits selected by said second half register multiplexer corresponding to said operand specified by said corresponding instruction for supply to said functional unit via a first operand bus, and
      a buffer connected to said second half multiplexer supplying said N bits selected by said second half register multiplexer corresponding to said operand specified by said corresponding instruction to said functional unit via a second operand bus, said buffer having a signal delay equivalent to a signal delay of said multiplexer.

2. The data processor of claim 1 wherein:
   when said fetched instruction specifies an operand size of N bits
      said multiplexer supplies said N bits selected by said first half register multiplexer or said N bits selected by said second half register multiplexer to said functional unit via said first operand bus, and said buffer supplies no bits to said functional unit via a second operand bus; and when said fetched instruction specifies an operand size of 2N bits said multiplexer supplies said N bits selected by said first half register multiplexer to said functional unit via said first operand bus, and said buffer supplies said N bits selected by said second half register multiplexer to said functional unit via said second operand bus.

3. The data processor of claim 1 wherein:

said operands further have a data size specified by said fetched instruction selected from a set including N bits, 2N bits and 4N bits;

said operand selection unit further comprises a first enable gate receiving said N bits selected by said second combinational unit and having an output connected to a third operand bus enabled by a 4N bit operand signal when said fetched instruction specifies an operand size of 4N bits, and a second enable gate receiving said N bits selected by said fourth combinational unit and having an output connected to a fourth operand bus enabled by said 4N bit operand signal;

when said fetched instruction specifies an operand size of N bits said multiplexer supplies said N bits selected by said first half register multiplexer or said N bits selected by said second half register multiplexer to said functional unit via said first operand bus, and said buffer supplies no bits to said functional unit via a second operand bus;

when said fetched instruction specifies an operand size of 2N bits said multiplexer supplies said N bits selected by said first half register multiplexer to said functional unit via said first operand bus, and said buffer supplies said N bits selected by said second half register multiplexer to said functional unit via said second operand bus; and when said fetched instruction specifies an operand size of 4N bits said multiplexer supplies said N bits selected by said first half register multiplexer to said functional unit via said first operand bus, said buffer supplies said N bits selected by said second half register multiplexer to said functional unit via said second operand bus, said first enable gate supplies said N bits selected by second combinational unit to said functional unit via a third operand bus, and said second enable gate supplies said N bits selected by said fourth combinational unit to said functional unit via a fourth operand bus.

* * * * *